US012074532B2

(12) United States Patent
Iida et al.

(10) Patent No.: US 12,074,532 B2
(45) Date of Patent: Aug. 27, 2024

(54) POWER CONVERSION DEVICE

(71) Applicant: HITACHI ASTEMO, LTD., Hitachinaka (JP)

(72) Inventors: Hiroaki Iida, Tochigi (JP); Shogo Tokita, Tochigi (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 263 days.

(21) Appl. No.: 17/619,835

(22) PCT Filed: Apr. 23, 2020

(86) PCT No.: PCT/JP2020/017434
§ 371 (c)(1),
(2) Date: Dec. 16, 2021

(87) PCT Pub. No.: WO2020/255558
PCT Pub. Date: Dec. 24, 2020

(65) Prior Publication Data
US 2022/0345049 A1 Oct. 27, 2022

(30) Foreign Application Priority Data

Jun. 21, 2019 (JP) .................. 2019-115610

(51) Int. Cl.
*H02M 7/00* (2006.01)
*H02M 7/48* (2007.01)
*H05K 7/20* (2006.01)

(52) U.S. Cl.
CPC ............. *H02M 7/003* (2013.01); *H02M 7/48* (2013.01); *H05K 7/209* (2013.01)

(58) Field of Classification Search
CPC ........ H05K 7/209; H02M 7/003; H02M 7/48; G06F 1/20; H01L 23/053; H01L 21/48;
(Continued)

(56) References Cited

U.S. PATENT DOCUMENTS 5,419,713 A * 5/1995 Northey .................. H05K 7/12
439/78
7,022,916 B1 * 4/2006 Cavanaugh .......... H05K 7/1491
174/72 A
(Continued)

FOREIGN PATENT DOCUMENTS

JP 55-003617 1/1980
JP 61-147554 7/1986
(Continued)

OTHER PUBLICATIONS

Goto Masaki, 'Semiconductor Device', Dec. 9, 2004, Mitsubishi Electric Corp, (PE2E Translation of JP 2004349614) (Year: 2004).*
(Continued)

*Primary Examiner* — Stephen S Sul
*Assistant Examiner* — Jeffrey Francis Stoll
(74) *Attorney, Agent, or Firm* — Rankin, Hill & Clark LLP

(57) ABSTRACT

A technology that prevents an encapsulation member encapsulating a semiconductor element from leaking between a resin-made casing and a heat dissipator is provided. A power conversion device includes a heat dissipator that includes a mount surface on which semiconductor elements are mounted, a resin-made casing that includes an intimate-contact surface that intimately contacts the mount surface, and which contains therein the semiconductor elements, and an encapsulation member that encapsulates the semiconductor elements within the casing. A first surrounding portion that surrounds the semiconductor elements is provided on the mount surface of the heat dissipator. A second surrounding portion that surrounds the semiconductor elements is provided on the intimate-contact surface of the casing. The first surrounding portion and the second surrounding portion are fitted with each other in the concavo-convex shape.

3 Claims, 6 Drawing Sheets

(58) Field of Classification Search
CPC ..... H01L 23/10; H01L 23/36; H01L 23/3107; H01L 2924/0002; H01L 2224/48091
See application file for complete search history.

(56) References Cited

U.S. PATENT DOCUMENTS

| | | | | |
|---|---|---|---|---|
| 9,418,910 | B2 * | 8/2016 | Miyamoto | .......... H01L 23/3735 |
| 2011/0059581 | A1 * | 3/2011 | Horio | .................... H01L 25/072 |
| | | | | 438/123 |

FOREIGN PATENT DOCUMENTS

| | | | | |
|---|---|---|---|---|
| JP | 2004-349614 | | 12/2004 | |
| JP | 2005-322784 | | 11/2005 | |
| JP | 2006-081312 | | 3/2006 | |
| JP | 5071405 | B2 * | 11/2012 | ......... H01L 23/3121 |
| WO | 2018-055667 | | 2/2019 | |

OTHER PUBLICATIONS

Sudo et al, 'Power Semiconductor Device', Nov. 14, 2012, Mitsubishi Electric Corp, Description (Translation of JP 5,071,405) (Year: 2012).*
International Search Report, Date of mailing: Jun. 9, 2020, 2 pages.

* cited by examiner

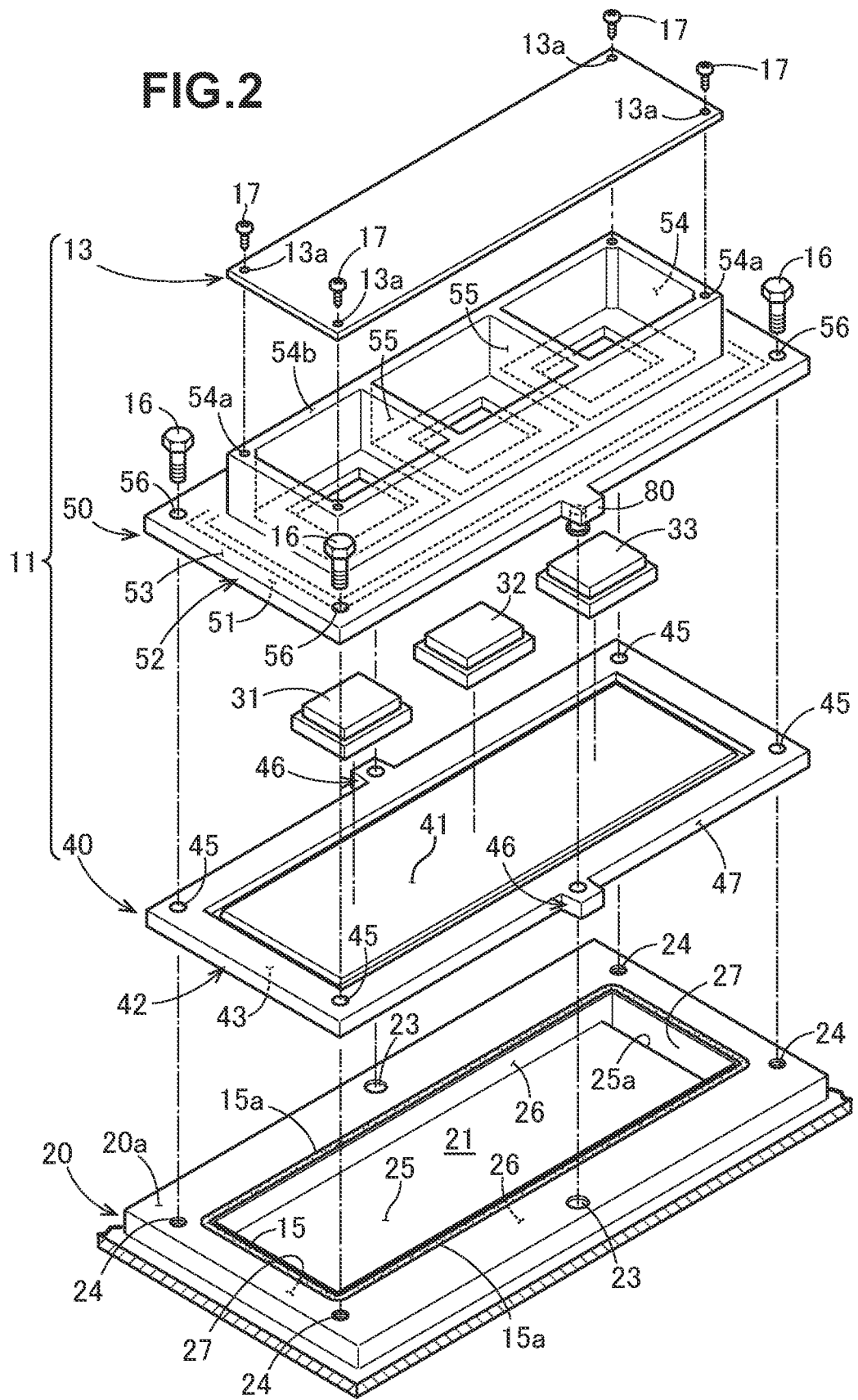

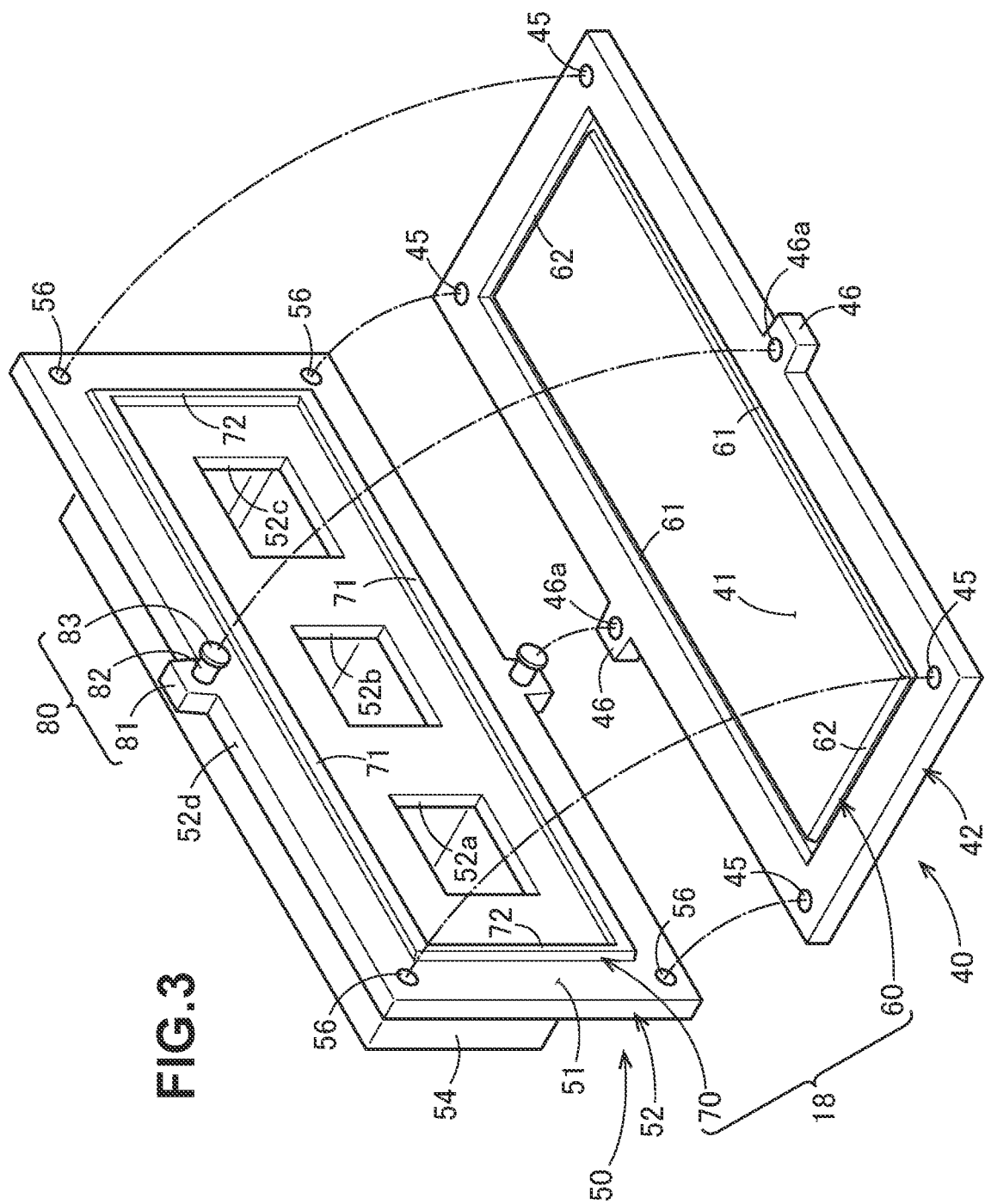

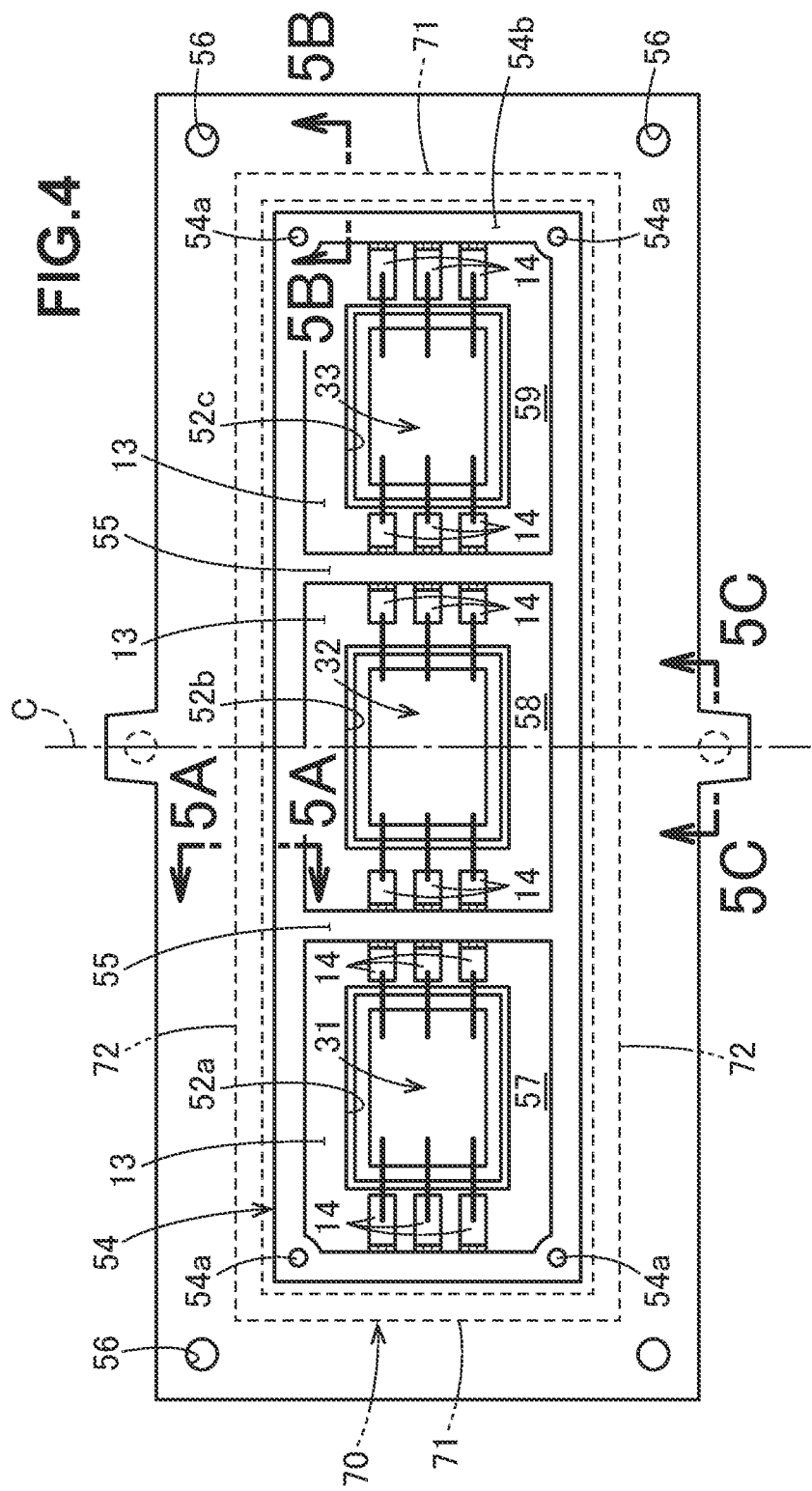

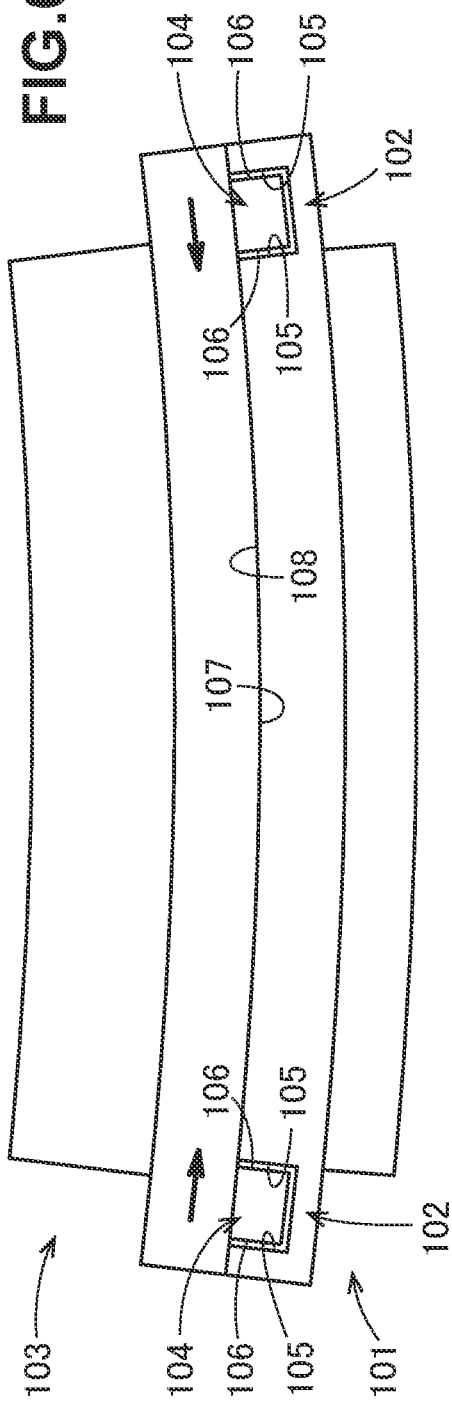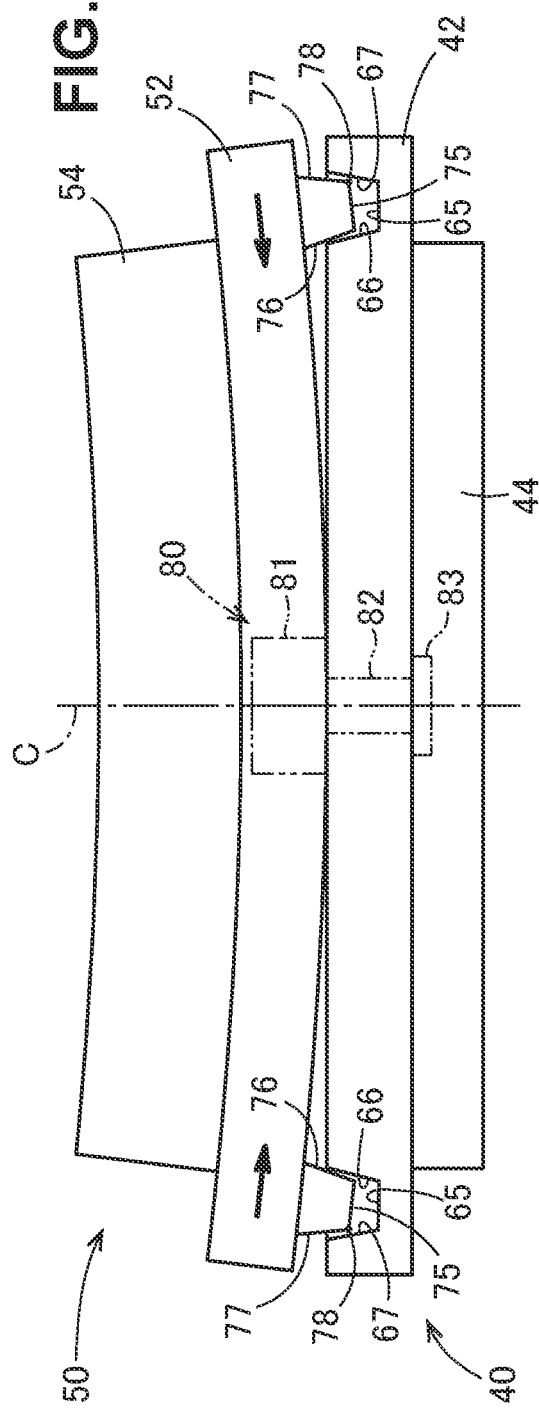

POWER CONVERSION DEVICE

TECHNICAL FIELD

The present disclosure relates to a power conversion device that has a resin-made casing fastened to a heat dissipator for a semiconductor element.

BACKGROUND ART

Power conversion devices are placed between, for example, a battery and a motor, control the electric power stored in the battery, and supply such power to the motor. Patent Document 1 discloses a conventional technology that is a semiconductor device which forms a part of a power conversion device.

The semiconductor device disclosed in Patent Document 1 includes a semiconductor element, a heat dissipator that dissipates heat generated by the semiconductor element, a resin casing that contains therein the semiconductor element, and an encapsulation member that encapsulates the semiconductor element.

The heat dissipator includes a top plate portion that has an attachment surface to which the semiconductor element is attached, and fins provided on the opposite surface to the attachment surface.

The resin casing includes a bottom plate portion that has an opposing surface to the attachment surface, and side wall portions extended upwardly from the circumferential edge of the bottom plate portion.

A description will be given of a process of fastening the casing to the heat dissipator. A plurality of protrusions is provided on a mount surface of a base plate of the heat dissipator. The plurality of protrusions is located annularly at a predetermined pitch. An adhesive is applied to the mount surface along the plurality of protrusions. The top plate portion of the heat dissipator and the bottom plate portion of the resin casing are fastened to each other by screws. In accordance with the protruding amount of the protrusions, a constant clearance between the bottom plate portion and the top plate portion is maintained.

A description will be given of a process of encapsulating the semiconductor element. When the encapsulation member in a gel shape is filled in a region surrounded by the side wall portions in the casing and the encapsulation member is cured, the semiconductor element is encapsulated.

CITATION LIST

Patent Literatures

Patent Document 1: JP 2005-322784 A

SUMMARY OF INVENTION

Technical Problem

The material of the casing and the material of the heat dissipator have different thermal expansion coefficients. The casing is a resin-made product. When the casing is taken out from a metal mold and is cooled, a resin may shrink and a casing may be warped. When, for example, the bottom plate portion of the casing is warped, a clearance between the opposing surface of the bottom plate portion of the casing and the mount surface of the top plate portion of the heat dissipator increases. In the process of encapsulating the semiconductor element contained in the casing, when the encapsulation member in a gel shape is filled in the casing, there is a possibility such that the encapsulation member may leak to the exterior from the clearance between the mount surface of the heat dissipator and the opposing surface of the casing. A structure that prevents the encapsulation member from leaking is desired.

An objective of the present disclosure is to provide a technology capable of preventing an encapsulation member for encapsulating a semiconductor element from leaking from a clearance between a resin-made casing and a heat dissipator.

Solution to Problem

Provided according to a first example embodiment of the present disclosure is a power conversion device that includes:
  a semiconductor element;
  a heat dissipator that includes a mount surface on which the semiconductor element is mounted;
  a resin-made casing which includes an intimate-contact surface that intimately contacts the mount surface, and which contains therein the semiconductor element; and
  an encapsulation member that encapsulates the semiconductor element within the casing, in which:
  the casing and the heat dissipator include respective fastening portions to be fastened with each other,
  a first surrounding portion that surrounds the semiconductor element as viewed in a direction along a normal line of the mount surface is provided on the mount surface of the heat dissipator,
  a second surrounding portion that surrounds the semiconductor element as viewed in a direction along a normal line of the intimate-contact surface is provided on the intimate-contact surface of the casing, and
  the first surrounding portion and the second surrounding portion are fitted with each other in the concavo-convex shape.

According to a second example embodiment of the present disclosure, preferably, either one of the first surrounding portion and the second surrounding portion includes a continuous groove portion, and the other one includes a continuous protrusion capable of being fitted with the groove portion.

According to a third example embodiment of the present disclosure, preferably, as viewed in a direction along a normal line of a surface in which the groove portion is provided, the groove portion is formed in a rectangular shape, and includes a pair of long sides in parallel with each other, and a pair of short sides in parallel with each other, a cross-sectional shape of the short side is formed in a tapered shape that increases a width from a bottom of the short side toward an opening, and the protrusion is formed in a shape along the groove portion.

According to a fourth example embodiment of the present disclosure, preferably, each of the fastening portions is located only at a center in a lengthwise direction of the casing.

According to a fifth example embodiment of the present disclosure, preferably, a through-hole is provided in the fastening portion of the heat dissipator, a pawl that passes completely through the through-hole is provided at the fastening portion of the casing so as to be integrated with the casing, and a dimension of a tip of the pawl is larger than an inner diameter of the through-hole.

Advantageous Effects of Invention

According to a first example embodiment of the present disclosure, the power conversion device includes the heat dissipator that includes the mount surface on which the semiconductor element is mounted, and the resin-made casing which includes an intimate-contact surface that intimately contacts the mount surface, and which contains therein the semiconductor element. The first surrounding portion that surrounds the semiconductor element as viewed in a direction along a normal line of the mount surface is provided on the mount surface of the heat dissipator. The second surrounding portion that surrounds the semiconductor element as viewed in a direction along a normal line of the intimate-contact surface is provided on the intimate-contact surface of the casing. The first surrounding portion and the second surrounding portion are fitted with each other in the concavo-convex shape.

That is, the mount surface of the casing and the intimate-contact surface of the resin-made case are provided with the respective concavo-convex portions that are fitted with each other. Those concavo-convex portions surround the semiconductor element as viewed in a direction along a normal line of such a surface. Hence, when the encapsulation member that encapsulates the semiconductor element is if filled in the resin-made casing, even if the encapsulation member enters between the mount surface and the intimate-contact surface, the encapsulation member is blocked by the surrounding portions fitted with each other in the concavo-convex shape. This can prevent the encapsulation member from leaking without an application of an adhesive.

Moreover, since the first surrounding portion and the second surrounding portion are fitted with each other in the concavo-convex shape, the casing and the heat dissipator can be positioned at respective predetermined positions.

According to the second example embodiment, either one of the first surrounding portion and the second surrounding portion includes a continuous annular groove portion, and the other one includes a continuous protrusion capable of being fitted with the groove portion. In comparison with a case in which concavities and convexities are intermittently formed on the respective mount surface and intimate-contact surface, the leaking encapsulation member can be surely blocked.

According to the third example embodiment, the groove portion is formed in a rectangular shape, and includes a pair of long sides in parallel with each other, and a pair of short sides in parallel with each other. The cross-sectional shape of the short side is formed in a tapered shape that increases a width from the bottom of the short side toward an opening. The protrusion is formed in a shape along the groove portion. When a warpage occurs on the casing, the displacement in the lengthwise direction is larger than that in the short-side direction. That is, the portion that extends in the short-side direction is largely displaced. The groove portion of the short side increases the width as coming close to the boundary between the casing and the heat dissipator. This facilitates the release of the fitting between the groove portion at the short side and the protrusion. This prevents the heat dissipator from being warped in accordance with the warpage of the casing.

According to the fourth example embodiment, the fastening portions is located only at a center in a lengthwise direction of the casing. If only one end in the lengthwise direction is fastened, the other end of the casing comes up relative to the heat dissipator, and thus the clearance between the other end of the casing and the heat dissipator increases. In contrast, when the fastening portion is located at the center, although both ends come up, the clearance between each end and the heat dissipator can be reduced.

According to the fifth example embodiment, a through-hole is provided in the fastening portion of the heat dissipator. A pawl that passes completely through the through-hole is provided at the fastening portion of the casing so as to be integrated with the casing, and the tip of the pawl is larger than the inner diameter of the through-hole. Hence, the pawl is not likely to be disengaged from the through-hole. When the casing is formed, the casing can be formed so as to be integrated with the heat dissipator. Fastening members like screws become unnecessary, and thus the number of parts can be reduced.

BRIEF DESCRIPTION OF DRAWINGS

FIG. 2 is an exploded perspective view of the power module illustrated in FIG. 1;

FIG. 3 is a diagram for describing a mount surface of a heat dissipator and an intimate-contact surface of a casing both illustrated in FIG. 2;

FIG. 4 is a diagram looking down a top surface of the casing illustrated in FIG. 1;

FIG. 6A is a diagram for describing a casing formed integrally together with a heat dissipator according to a comparative example, and FIG. 6B is a diagram for describing a casing formed integrally together with a heat dissipator according to the embodiment.

DESCRIPTION OF EMBODIMENTS

Embodiments of the present disclosure will be described below with reference to the accompanying figures.

Figure 1:
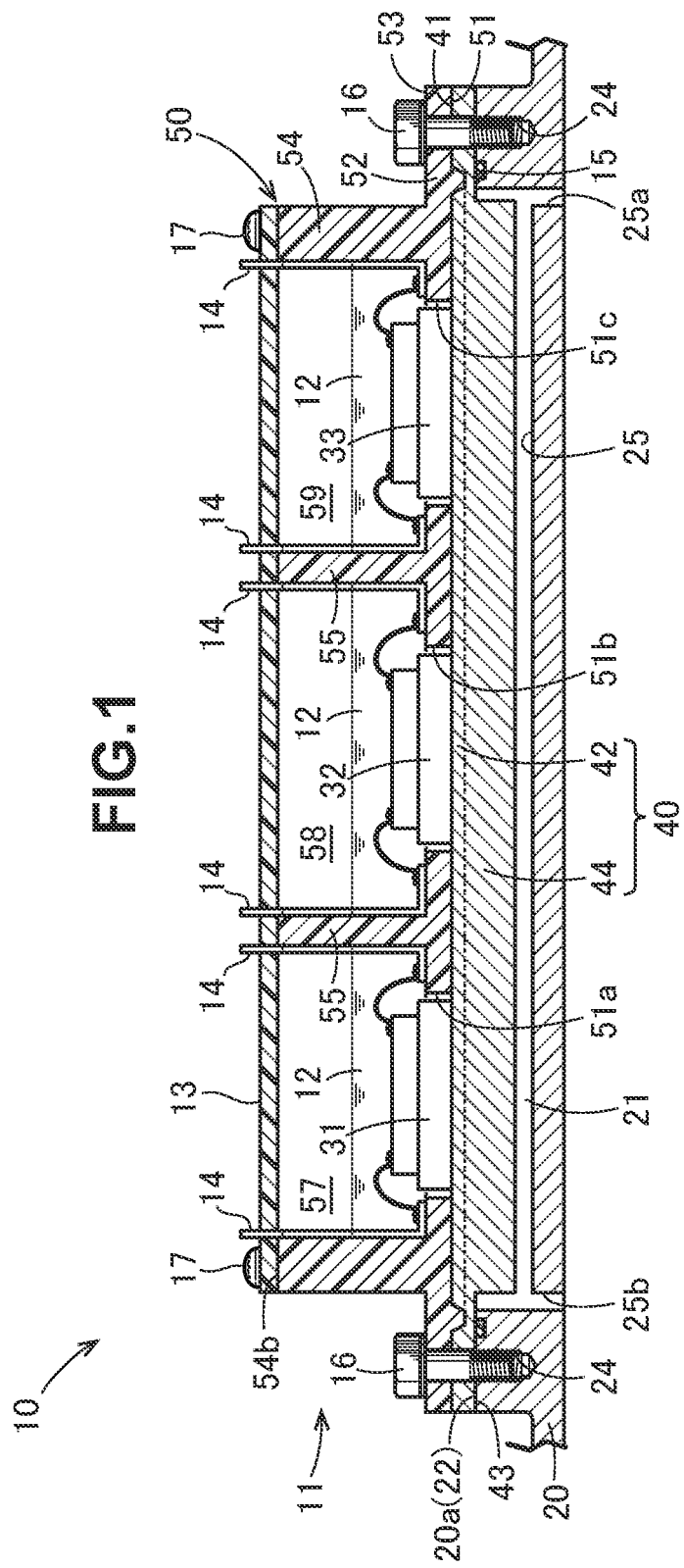
FIG. 1 is a cross-sectional view a power module that forms a power conversion device according to an embodiment.

FIG. 1 illustrates a power module 11 that forms a power conversion device 10. The power conversion device 10 is loaded on, for example, a vehicle, placed between a battery and a motor, controls electric power stored in the battery, and supplies such power to the motor.

With reference to FIG. 1 and FIG. 2, the power module 11 includes a generator 31 (will be referred to as a first semiconductor 31 below) for taking out electric power from an engine, a voltage control unit 32 (will be referred to as a second semiconductor 32 below), a traction controller 33 (will be referred to as a third semiconductor 33 below), a heat dissipator 40 on which the first semiconductor 31 to the third semiconductor 33 are mounted and which dissipates heat generated from the semiconductors 31 to 33, a resin-made casing 50 that contains therein the first semiconductor 31 to the third semiconductor 33, an encapsulation member 12 that encapsulates the first semiconductor 31 to the third semiconductor 33, and a circuit board 13 that controls the motor. The circuit board 13 and the first semiconductor 31 to the third semiconductor 33 are electrically connected to each other by terminals 14 provided on the casing 30.

The power module 11 is mounted on the upper part of a casing 20 of the power conversion device 10. A flow channel 21 through which a cooling medium that cools down the heat dissipator 40 flows is provided in a top surface 20a of the casing 20. The flow channel 21 is opened upwardly, and it is closed by the heat dissipator 40.

With reference to FIG. 2, an opening of the flow channel 21 is formed in a rectangular shape. A sealing member 15 is provided along an edge 22 of the opening of the flow channel 21. Portions of the sealing member 15 extending in the lengthwise direction will be defined as a pair of long sides 15a and 15a. Respective recesses 23 opened toward the heat dissipator 40 are formed at the external sides of the pair of long sides 15a and 15a. Screw holes 24 are opened at the four corners of the edge 22 of the opening, respectively.

Inner surfaces of the flow channel 21 include a bottom surface 25 provided with an inlet port 25a of the cooling medium and an outlet port 25b thereof, a pair of long wall surfaces 26 and 26 which extend in the lengthwise direction and which face with each other, and a pair of short wall surfaces 27 and 27 which extend in the short-side direction and which face with each other. The cooling medium flows along the long wall surfaces 26 and 26.

An example material of the heat dissipator 40 applicable is copper having undergone nickel plating. The heat dissipator 40 includes a top plate portion 42 that includes a mount surface 41 on which the first semiconductor 31 to the third semiconductor 33 can be mounted, and fins 44 which are provided on a lower surface 43 at the opposite side to the mount surface 41, and which can contact the cooling medium that flows through the flow channel 21. The lower surface 43 of the top plate portion 42 abuts the edge 22 of the opening of the flow channel 21.

The casing 50 includes a bottom plate portion 52 that includes an intimate-contact surface 51 which can intimately contact the mount surface 41 of the heat dissipator 40, a circumferential wall portion 54 provided on a top surface 53 opposite to the intimate-contact surface 51, and two dividing portions 55 and 55 that divide the region surrounded by the circumferential wall portion 54.

A first expose hole 52a that can expose the first semiconductor 31 is opened in the bottom plate portion 52. Similarly, a second expose hole 52b that can expose the second semiconductor 32, and a third expose hole 52c that can expose the third semiconductor 33 are opened in the bottom plate portion 52.

Fastening holes 45 are opened at the four corners of the top plate portion 42 of the heat dissipator 40, respectively. Fastening holes 56 are opened at the four corners of the bottom plate portion 52 of the casing 50, respectively. Fastening members like screws 16 pass completely through the respective fastening holes 56 and 45, and are fastened with the respective screw holes 24. Hence, the heat dissipator 40 and the casing 50 are fastened to the top surface 20a of the casing 20.

Fastening holes 13a are opened at the four corners of the circuit board 13, respectively. Screw holes 54a are opened at the four corners of the circumferential wall portion 54, respectively. Fastening members like screws 17 pass completely through the respective fastening holes 13a, and are fastened with the respective screw holes 54a. Hence, the circuit board 13 is fastened to an upper end surface 54b of the circumferential wall portion 54 of the casing 50.

With reference to FIG. 3, the mount surface 41 of the heat dissipator 40 and the intimate-contact surface 51 of the casing 50 which can intimately contact with the mount surface 41 are fitted with each other by a fitting structure 18 in a concavo-convex shape. The fitting structure 18 includes a continuous annular groove portion 60 (a first surrounding portion) formed in the mount surface 41 of the top plate portion 42 of the heat dissipator 40, and an annular protrusion 70 (a second surrounding portion) which is formed on the intimate-contact surface 51 of the heat dissipator 40, and which can be fitted with the groove portion 60.

The groove portion 60 is formed in a rectangular shape as viewed from a direction along the normal line of the mount surface 41, and includes a pair of long groove portions 61 (long sides) in parallel with each other, and a pair of short groove portions 62 (short sides) in parallel with each other.

The protrusion 70 surrounds the first expose hole 52a to the third expose hole 52c. The protrusion 70 is formed in a rectangular shape as viewed from a direction along the normal line of the intimate-contact surface 51, and includes a pair of long protrusions 71 (long sides) in parallel with each other, and a pair of short protrusions 72 (short sides) in parallel with each other.

Note that as the fitting structure 18, the protrusion 70 may be formed on the heat dissipator 40, and the groove portion 60 may be formed in the casing 50. Moreover, as the fitting structure 18, a plurality of concavities and convexities may be intermittently and annularly provided.

With reference to FIG. 4, the two dividing portions 55 and 55 divide an inner region of the circumferential wall portion 54 into to a first region 57 to a third region 59. The first semiconductor 31 exposed from the first expose hole 52a is located in the first region 57. The second semiconductor 32 exposed from the second expose hole 52b is located in the second region 58. The third semiconductor 33 exposed from the third expose hole 52c is located in the third region 59. As viewed from a direction along the normal line of the top surface 53 of the bottom plate portion 52 (see FIG. 4), the protrusion 70 surrounds the circumferential wall portion 54.

Figure 5A:
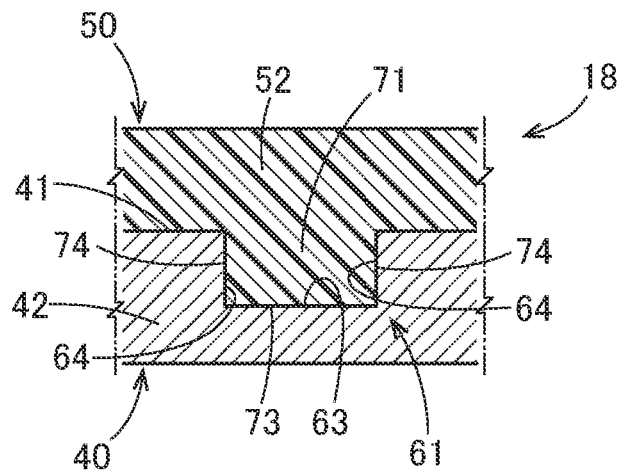
FIG. 5A is cross-sectional view taken along a line 5a-5a, FIG. 5B is a cross-sectional view taken along a line 5b-5b.

FIG. 5A illustrates the cross section of the fitting structure 18 that includes the one long groove portion 61 and the one long protrusion 71. The cross-sectional shape of the long groove portion 61 is rectangular, and includes a first bottom surface 63 in parallel with the mount surface 41, and a pair of first side surfaces 64 and 64 that extend from respective ends of the first bottom surface 63 toward the mount surface 41. Each first side surface 64 intersects at right angle with the mount surface 41 of the top plate portion 42 of the heat dissipator 40.

Each long protrusion 71 includes a first abutting surface 73 that abuts the first bottom surface 63, and second abutting surfaces 74 and 74 that abut the first side surfaces 64 and 64, respectively.

Figure 5B:
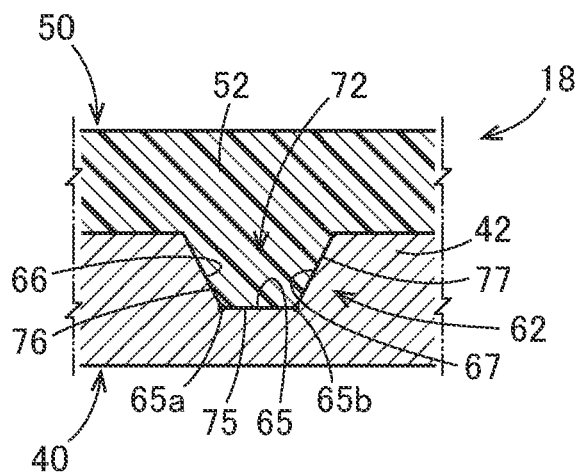
FIG. 5C is a cross-sectional view taken along a line 5c-5c.

FIG. 5B illustrates the cross section of the fitting structure 18 that includes the one short groove portion 62 and the one short protrusion 72. The cross-sectional shape of the short groove portion 62 is tapered that increases the width from a second bottom surface 65 (bottom) of the short groove portion 62 toward the opening.

More specifically, the short groove portion 62 includes an inward inclined surface 66 that inclines inwardly with reference to a basal point that is an end 65a located at the internal side (a direction coming close to the heat dissipator 40 and a center C (see FIG. 4) of the casing 50) of the second bottom surface 65, and an outward inclined surface 67 that inclines outwardly with reference to a basal point that is the other end 65b located at the external side (a direction apart from the center C) of the bottom surface 25. The second bottom surface 65 is in parallel with the mount surface 41.

The short protrusion 72 is in a shape in accordance with the above-described short groove portion 62. The short protrusion 72 includes a tip surface 75 that abuts the second bottom surface 65, an inward contact surface 76 that abuts the inward inclined surface 66, and an outward contact surface 77 that abuts the outward inclined surface 67.

The other short groove portion 62 and short protrusion 72 employ the same structure. The description thereof will be thus omitted. The cross-sectional shape of the short groove portion 62 and that of the short protrusion 72 may be not only a trapezoidal shape described in the embodiment but a polygonal shape like a triangular shape.

With reference to FIG. 2 and FIG. 3, the heat dissipator 40 and the casing 50 include fastening portions 46 and 80, respectively. The fastening portions 46 of the heat dissipator 40 are formed integrally with the heat dissipator 40 at respective side surfaces 47 of the top plate portion 42 in the lengthwise direction. A through-hole 46a that passes completely through the top plate portion 42 in the thickness direction is opened at the fastening portion 46 of the heat dissipator 40.

For the purpose of the description on the fitting structure 18, the casing 50 and the heat dissipator 40 separated from each other are illustrated in FIG. 2 and FIG. 3, but the casing 50 is assembled so as to be integrated with the heat dissipator 40. That is, the heat dissipator 40 is placed on the mold of the casing 50, and the resin is applied to the mold, and thus the casing 50 integrated with the heat dissipator 40 is obtained.

Figure 5C:
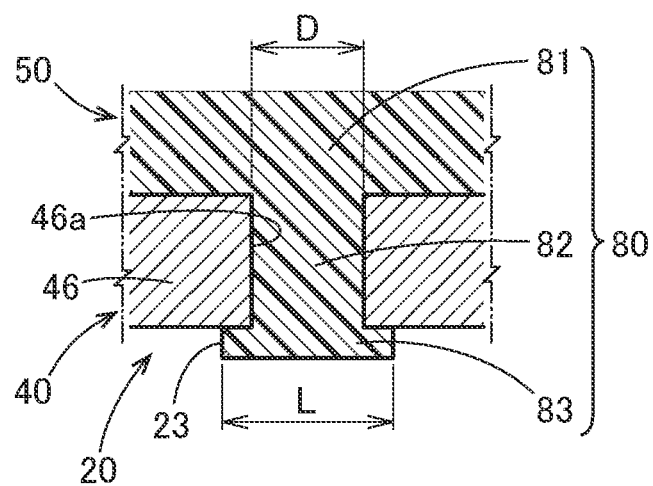

With reference to FIG. 3 and FIG. 5C. The fastening portions 80 of the casing 50 are formed at respective side surfaces 52d of the bottom plate portion 52 in the lengthwise direction so as to be integrated with the casing 50. Each fastening portion 80 of the casing 50 includes a base 81 provided at the side surface 52d of the bottom plate portion 52, and a pawl 82 which extends from the base 81 toward the heat dissipator 40, and which is to pass completely through the through-hole 46a. A dimension L of a tip 83 of the pawl 82 is larger than an inner diameter D of the through-hole 46a. Note that the casing 50 and the heat dissipator 40 may be formed separately, and those may be fastened to each other by fastening members like screws.

Advantageous effects of the embodiment will be described.

With reference to FIG. 3 and FIG. 4, the power conversion device 10 includes the heat dissipator 40 that includes the mount surface 41 on which the semiconductor element is mounted, and the resin-made casing 50 which includes the intimate-contact surface 51 that intimately contacts the mount surface 41, and which contains therein the semiconductor element. The groove portion 60 (the first surrounding portion) that surrounds the semiconductor element is formed in the mount surface 41 of the heat dissipator 40. The protrusion 70 (the second surrounding portion) that surrounds the semiconductor element is provided on the intimate-contact surface 51 of the casing 50. The groove portion 60 and the protrusion 70 are fitted with each other in the concavo-convex shape (see FIG. 5A and FIG. 5B).

With reference to FIG. 1 and FIG. 4, when the first semiconductor 31 is to be encapsulated, the encapsulation member 12 in the gel shape is filled in the first region 57. Even if the encapsulation member 12 enters between the mount surface 41 and the intimate-contact surface 51, the encapsulation member 12 is blocked by the groove portion 60 and the protrusion 70 which are fitted with each other in the concavo-convex shape. Hence, the encapsulation member 12 can be prevented from leaking without applying an adhesive.

In addition, since the groove portion 60 and the protrusion 70 are fitted with each other in the concavo-convex shape, the casing 50 and the heat dissipator 40 can be retained at predetermined positions, respectively, relative to each other.

With reference to FIG. 3, the groove portion 60 is formed continuously. The protrusion 70 is formed continuously. In comparison with, for example, a fitting structure in which concavities and convexities are intermittently formed on both the mount surface 41 and the intimate-contact surface 51, the encapsulation member that enters between the casing 50 and the heat dissipator 40 can be surely blocked.

With reference to FIG. 4, when the casing 30 is warped, the displacement in the lengthwise direction is greater than that in the short-side direction. That is, the pair of short protrusions 72 and 72 are displaced in the lengthwise direction so as to come close to each other.

With reference to FIG. 6A, according to a comparative example, the cross-sectional shapes of short groove portions 102 and 102 of a heat dissipator 101 are rectangular. The cross-sectional shapes of short protrusions 104 and 104 of a casing 103 are rectangular. Side surfaces 105 and 105 of the short groove portion 102 intersect at right angle to a mount surface 108. Side surfaces 106 and 106 of the short protrusion 104 intersect at right angle to an intimate-contact surface 107.

When the casing 103 cooled after the formation of the case 103 shrinks, the casing 103 deforms in such a way that the short protrusions 104 and 104 come close to each other. The warpage of the casing 103 causes the short protrusions 104 and 104 to be get stuck with the short groove portions 102 and 102. Together with the warpage of the casing 103, the heat dissipator 101 is also warped.

With reference to FIG. 5B, the short groove portion 62 includes the inward inclined surface 66 that is inclined inwardly, and the outward inclined surface 67 that is inclined outwardly. The short protrusion 72 includes the inward contact surface 76 that abuts the inward inclined surface 66, and the outward contact surface 77 that abuts the outward inclined surface 67.

With reference to FIG. 6B, since all of the side surfaces 66, 67, 76, and 77 are also inclined, the inward inclined surface 66 is likely to slide over the inward contact surface 76. Corners 78 of the tip surface 75 and the outward contact surface 77 are not likely to contact the outward inclined surface 67. The fitting between the short groove portion 62 and the short protrusion 72 becomes easily disengaged. The warpage of the heat dissipator 40 in accordance with the warpage of the casing 50 can be prevented.

With reference to FIG. 4 and FIG. 6B, the fastening portions 80 of the casing 50 are located at the center of the casing 50 in the respective lengthwise directions thereof. If the fastening portions 80 are provided at the one end 50a in the respective lengthwise directions, the other end 50b of the casing 50 comes up relative to the heat dissipator 40, and thus a clearance between the other end 50b of the casing 50 and the heat dissipator 40 becomes widespread. In contrast, when the fastening portions 80 are located at the center of the casing 50, although both ends come up, the clearance between each end 50a, 50b and the heat dissipator 40 can be reduced.

With reference to FIG. 5C, the through-hole 46a that passes completely through in the thickness direction of the top plate portion 42 is opened in each fastening portion 46 of the heat dissipator 40. Each fastening portion 80 of the casing 50 includes the pawl 82 that is to pass completely through the through-hole 46a. The dimension L of the tip 83 of the pawl 82 is larger than the inner diameter D of the through-hole 46a. Hence, the pawl 82 does not come out from the through-hole 46a. When the casing 50 is formed, the casing 50 and the heat dissipator 40 can be integrated. Fastening members like screws become unnecessary, and thus the number of parts can be reduced.

With reference to FIG. 2 and FIG. 5C, the tip 83 of the pawl 82 is fitted in the recess 23 formed in the top surface 20a of the casing 20. The recess 23 can serve for positioning when the power module 11 is attached to the casing 20.

Note that the power conversion device according to the present disclosure is also applicable to other vehicles than a hybrid vehicle, and other conveyances. That is, as far as the actions and advantageous effects of the present disclosure are accomplishable, the present disclosure is not limited to the embodiments.

INDUSTRIAL APPLICABILITY

The power conversion device according to the present disclosure is suitable for a four-wheel vehicle.

REFERENCE SIGNS LIST

10 Power conversion device
11 Power module
12 Encapsulation member
18 Fitting structure
31 Generator (first semiconductor)
32 Voltage control unit (second semiconductor)
33 Traction controller (third semiconductor)
40 Heat dissipator
41 Mount surface
42 Top plate portion
46 Fastening portion
46a Through-hole
47 Side surface
50 Casing
51 Intimate-contact surface
52 Bottom plate portion
60 Groove portion (first surrounding portion)
61 Long groove portion (long side)
62 Short groove portion (short side)
63 First bottom surface
64 First side surface
65 Second bottom surface
65a One end
65b Other end
66 Inward inclined surface
67 Outward inclined surface
70 Protrusion (second surrounding portion)
71 Long protrusion (long side)
72 Short protrusion (short side)
73 First abutting surface
74 Second abutting surface
75 Tip surface
76 Inward contact surface
77 Outward contact surface
78 Corner
80 Fastening portion
81 Base
82 Pawl
83 Tip
C Center of casing
L Dimension of tip
D Inner diameter of through-hole

The invention claimed is:

1. A power conversion device comprising:
a semiconductor element;
a heat dissipator that comprises a mount surface on which the semiconductor element is mounted;
a resin-made casing which comprises an intimate-contact surface that intimately contacts the mount surface, and which contains therein the semiconductor element; and
an encapsulation member that encapsulates the semiconductor element within the casing,
wherein the casing and the heat dissipator comprise respective fastening portions to be fastened with each other,
wherein the fastening portion of the casing is molded to the casing between a plurality of fastening holes, and
wherein the fastening portion of the casing comprises a base that protrudes away from the casing and a pawl that extends downward from the base,
wherein a second surrounding portion that surrounds the semiconductor element as viewed in a direction along a normal line of the intimate-contact surface is provided on the intimate-contact surface of the casing,
wherein the first surrounding portion and the second surrounding portion are fitted with each other in the concavo-convex shape;
wherein either one of the first surrounding portion and the second surrounding portion comprises a continuous groove portion, and the other one comprises a continuous protrusion capable of being fitted with the groove portion;
wherein, as viewed in a direction along a normal line of a surface in which the groove portion is provided, the groove portion is formed in a rectangular shape, and comprises a pair of long sides in parallel with each other, and a pair of short sides in parallel with each other,
a cross-sectional shape of the long side is rectangular with constant width from the bottom of the long side toward the surface, and
a cross-sectional shape of the short side is formed in a tapered shape that increases a width from a bottom of the short side toward the surface, and the protrusion is formed in a shape along the groove portion.

2. The power conversion device according to claim 1, wherein each of the fastening portions is located only at a center in a lengthwise direction of the casing.

3. The power conversion device according to claim 1, wherein:
a through-hole is provided in the fastening portion of the heat dissipator;
the pawl passes completely through the through-hole and is provided at the fastening portion of the casing so as to be integrated with the casing; and
a dimension of a tip of the pawl is larger than an inner diameter of the through-hole.

* * * * *